United States Patent
Huang et al.

(10) Patent No.: US 10,438,794 B2
(45) Date of Patent: Oct. 8, 2019

(54) SEMICONDUCTOR DEVICE AND METHOD OF FORMING THE SAME

(71) Applicant: GlobalWafers Co., Ltd., Hsinchu (TW)

(72) Inventors: Yen-Lun Huang, Hsinchu (TW); Jia-Zhe Liu, Hsinchu (TW); Man-Hsuan Lin, Hsinchu (TW)

(73) Assignee: GlobalWafers Co., Ltd., Hsinchu (TW)

( * ) Notice: Subject to any disclaimer, the term of this patent is extended or adjusted under 35 U.S.C. 154(b) by 0 days.

(21) Appl. No.: 15/886,840

(22) Filed: Feb. 2, 2018

(65) Prior Publication Data
US 2019/0006178 A1   Jan. 3, 2019

(30) Foreign Application Priority Data

Jun. 29, 2017  (TW) .............................. 106121769 A

(51) Int. Cl.
| | |
|---|---|
| H01L 21/02 | (2006.01) |
| H01L 29/20 | (2006.01) |
| H01L 29/205 | (2006.01) |
| H01L 33/00 | (2010.01) |
| H01L 33/12 | (2010.01) |
| H01L 33/04 | (2010.01) |

(52) U.S. Cl.
CPC .... *H01L 21/02505* (2013.01); *H01L 21/0254* (2013.01); *H01L 21/0262* (2013.01); *H01L 21/02381* (2013.01); *H01L 21/02458* (2013.01); *H01L 29/205* (2013.01); *H01L 33/007* (2013.01); *H01L 33/12* (2013.01); *H01L 21/02433* (2013.01); *H01L 21/02631* (2013.01); *H01L 29/2003* (2013.01); *H01L 33/04* (2013.01)

(58) Field of Classification Search
CPC ... H01L 33/12; H01L 33/007; H01L 33/0075; H01L 21/02505; H01L 21/02507; H01L 21/0254; H01L 21/02458; H01L 29/2003
See application file for complete search history.

(56) References Cited

U.S. PATENT DOCUMENTS

| | | | |
|---|---|---|---|
| 2015/0340230 A1* | 11/2015 | Ikuta | H01L 21/02381 257/76 |
| 2017/0154986 A1* | 6/2017 | Su | H01L 21/0254 |

FOREIGN PATENT DOCUMENTS

JP       2013069983        4/2013

OTHER PUBLICATIONS

"Office Action of Taiwan Counterpart Application," dated Jan. 24, 2019, p. 1-p. 4.

* cited by examiner

*Primary Examiner* — David C Spalla
(74) *Attorney, Agent, or Firm* — JCIPRNET

(57) ABSTRACT

A semiconductor device including a substrate, a semiconductor layer, and a buffer structure is provided. The semiconductor layer is located on the substrate. The buffer structure is located between the substrate and the semiconductor layer. The buffer structure includes a plurality of first layers and a plurality of second layers. The first layers and the second layers are alternately stacked with a same pitch or different pitches.

11 Claims, 4 Drawing Sheets

SEMICONDUCTOR DEVICE AND METHOD OF FORMING THE SAME

CROSS-REFERENCE TO RELATED APPLICATION

This application claims the priority benefit of Taiwan application serial no. 106121769, filed on Jun. 29, 2017. The entirety of the above-mentioned patent application is hereby incorporated by reference herein and made a part of this specification.

BACKGROUND OF THE INVENTION

1. Field of the Invention

The invention relates to an integrated circuit and a method of forming the same. More particularly, the invention relates to a semiconductor device having a buffer structure and a method of forming the same.

2. Description of Related Art

Generally, the semiconductor structure in which the III group nitride semiconductor layer is formed on the heterogeneous substrate (e.g., a sapphire substrate, SiC substrate, and other similar substrates) has been widely applied to light-emitting devices.

Nevertheless, lattice mismatch and differences in thermal expansion coefficients between the silicon substrate and the III group nitride semiconductor layer can easily lead to problems such as deformation of the silicon substrate and cracks generated on the III group nitride semiconductor layer. Besides, the silicon element in the silicon substrate may easily diffuse into the III group nitride semiconductor layer to form eutectic metal with the III group nitride metal (e.g., gallium), and consequently, the melt-back phenomenon occurs, and substrate flatness and epitaxial quality are thereby damaged. One layer of aluminium nitride (AlN) layer is thus inserted between the III group nitride semiconductor layer and the silicon substrate most of the time by the industry, so as to prevent melt-back etching from happening.

According to the related art, a buffer layer is disposed to reduce differences in lattice coefficients between the semiconductor layer and the substrate or to release stress generated by heteroepitaxy for increasing crystal quality of epitaxy. It can thus be seen that the thickness of the buffer layer is positively related to epitaxial quality. The buffer layer with overly thick thickness may enhance crystal quality, but differences in thermal expansion coefficients between the silicon substrate and the III group nitride epitaxial semiconductor layer may also lead to substrate bow. Nevertheless, the existing technology is in short of a design method and structure of the buffer layer which can deliver favorable crystal quality and prevent substrate bow at the same time.

SUMMARY OF THE INVENTION

The invention provides a semiconductor device having a buffer structure and a method of forming the same in which lattice mismatch and differences in thermal expansion coefficients between a silicon substrate and an III group nitride semiconductor layer are reduced, such that silicon substrate is prevented from being deformed and cracks generated on the III group nitride semiconductor layer are reduced.

The invention further provides a semiconductor device having a buffer structure and a method of forming the same in which an epitaxial stress of an III group nitride semiconductor layer is decreased and an epitaxial thickness of the III group nitride semiconductor layer is increased, such that a breakdown voltage of the semiconductor device is further increased.

In an embodiment of the invention, a semiconductor device includes a substrate, a semiconductor layer, and a buffer structure. The semiconductor layer is located on the substrate. The buffer structure is located between the substrate and the semiconductor layer. The buffer structure includes a plurality of first layers and a plurality of second layers. The first layers and the second layers are alternately stacked. A number of the first layers is greater than or equal to 56, and a bow of the semiconductor device is less than 10 μm.

In an embodiment of the invention, when the first layers and the second layers are alternately stacked with a same pitch, a sum of thicknesses of the first layers accounts for 17% to 21% of a total thickness of the buffer structure.

In an embodiment of the invention, the number of the first layers ranges between 56 and 70.

In an embodiment of the invention, the buffer structure has a bottom region, a middle region, and a top region. When the first layers and the second layers are alternately stacked with different pitches, the number of the first layers at the bottom region is equal to the number of the first layers at the top region, and the number of the first layers at the bottom region is greater than the number of the first layers at the middle region. The sum of thicknesses of the first layers accounts for less than 20% of the total thickness of the buffer structure.

In an embodiment of the invention, the buffer structure has a bottom region, a middle region, and a top region. When the first layers and the second layers are alternately stacked with different pitches, the number of the first layers at the top region is greater than the number of the first layers at the bottom region, and the number of the first layers at the bottom region is equal to the number of the first layers at the middle region. The sum of thicknesses of the first layers accounts for less than 20% of the total thickness of the buffer structure.

In an embodiment of the invention, the first layers include AlN. The second layers include $Al_xGa_{1-x}N$, and $0 \le X \le 1$. Aluminum (Al) contents (i.e., X values) of the second layers gradually change in a direction from the substrate toward the semiconductor layer.

In an embodiment of the invention, the semiconductor device further includes a nucleation layer located between the substrate and the buffer structure.

In an embodiment of the invention, a method of forming a semiconductor device includes: providing a substrate and forming a semiconductor layer on the substrate; forming a buffer structure between the substrate and the semiconductor layer, wherein the buffer structure includes a plurality of first layers and a plurality of second layers, the first layers and the second layers are alternately stacked, a number of the first layers is greater than or equal to 56, and a bow of the semiconductor device is less than 10 μm.

In an embodiment of the invention, when the first layers and the second layers are alternately stacked with a same pitch, a sum of thicknesses of the first layers accounts for 17% to 21% of a total thickness of the buffer structure.

In an embodiment of the invention, the number of the first layers ranges between 56 and 70.

In an embodiment of the invention, the buffer structure has a bottom region, a middle region, and a top region. When the first layers and the second layers are alternately stacked with different pitches, the number of the first layers at the bottom region is equal to the number of the first layers at the top region, and the number of the first layers at the bottom region is greater than the number of the first layers at the middle region. The sum of thicknesses of the first layers accounts for less than 20% of the total thickness of the buffer structure.

In an embodiment of the invention, the buffer structure has a bottom region, a middle region, and a top region. When the first layers and the second layers are alternately stacked with different pitches, the number of the first layers at the top region is greater than the number of the first layers at the bottom region, and the number of the first layers at the bottom region is equal to the number of the first layers at the middle region. The sum of thicknesses of the first layers accounts for less than 20% of the total thickness of the buffer structure.

To sum up, the buffer structure of the embodiments of the invention is formed between the substrate and the semiconductor layer. The buffer structure includes plural first layers and plural second layers. The first layers and the second layers are alternately stacked with the same pitch or with different pitches. In the buffer structure provided by the embodiments of the invention, lattice mismatch and differences in thermal expansion coefficients between the substrate and the semiconductor layer are reduced, such that the substrate is further prevented from being deformed and cracks generated on the semiconductor layer are reduced. In addition, the epitaxial stress of the semiconductor layer may be decreased and the epitaxial thickness of the semiconductor layer is increased through the buffer structure provided by the embodiments of the invention, and thereby, the breakdown voltage of the semiconductor device is further increased.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
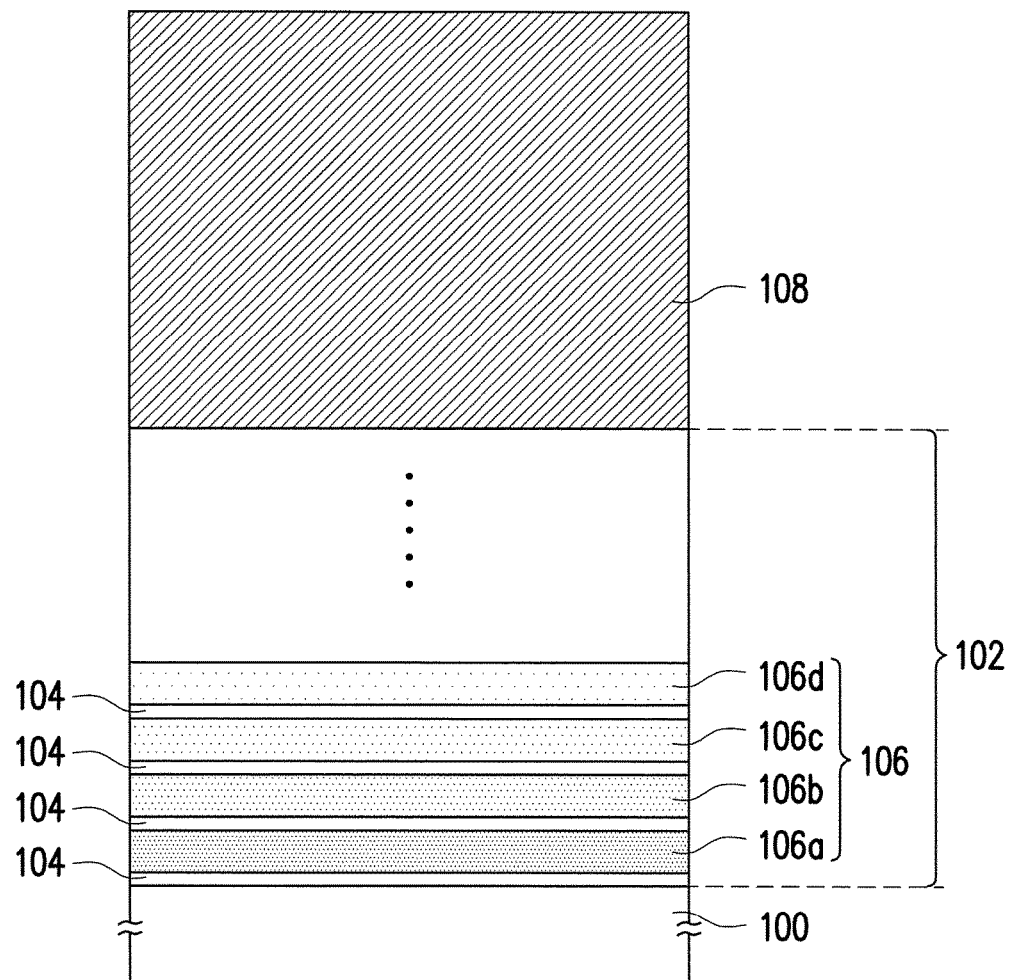
FIG. 1 is a schematic cross-sectional diagram of a semiconductor device according to a first embodiment of the invention.

Reference will now be made in detail to the present preferred embodiments of the disclosure, examples of which are illustrated in the accompanying drawings. Wherever possible, the same reference numbers are used in the drawings and the description to refer to the same or like parts.

FIG. 1 is a schematic cross-sectional diagram of a semiconductor device according to a first embodiment of the invention.

With reference to FIG. 1, a semiconductor device 10 of the first embodiment includes a substrate 100, a buffer structure 102, and a semiconductor layer 108. In an embodiment, the substrate 100 may be a silicon substrate, and a crystal plane of the substrate 100 may be, for example but not limited to (111), (110), (100), etc. In other embodiments, the substrate 100 may be a silicon-on-insulator (SOI) substrate. Besides, the substrate 100 may also be a substrate of an N type conductivity type or a P type conductivity type.

The buffer structure 102 is located on the substrate 100. Specifically, the buffer structure 102 includes a plurality of first layers 104 and a plurality of second layers 106. The first layers 104 and the second layers 106 are alternately stacked on the substrate 100. The first layers 104 may be aluminum nitride (AlN) layers, the second layers 106 include $Al_xGa_{1-x}N$, and $0 \le X \le 1$. Aluminum (Al) contents (i.e., X values) of the second layers 106 gradually decrease in a direction from the substrate 100 toward the semiconductor layer 108. That is, the Al content of a second layer 106a close to the substrate 100 is greater than the Al content of a second layer 106d distant from the substrate 100. A method of gradually decreasing the Al contents of the second layers 106 includes step grading, continuous grading, discontinuous grading, or a combination thereof. Taking the continuous grading for example, the second layer 106a may be an AlN layer (i.e., X=1); a second layer 106b may be an $Al_{0.9}Ga_{0.1}N$ layer (i.e., X=0.9); a second layer 106c may be an $Al_{0.8}Ga_{0.2}N$ layer (i.e., X=0.8); the second layer 106d may be an $Al_{0.7}Ga_{0.3}N$ layer (i.e., X=0.7), and the rest may be deduced by analogy. Taking the step grading for example, the second layer 106a may include a plurality of AlN layers alternately stacked; the second layer 106b may include the AlN layers alternately stacked and a plurality of $Al_{0.9}Ga_{0.1}N$ layers; the second layer 106c may include the AlN layers alternately stacked and a plurality of $Al_{0.8}Ga_{0.2}N$ layers; the second layer 106d may include the AlN layers alternately stacked and a plurality of $Al_{0.7}Ga_{0.3}N$ layers, and the rest may be deduced by analogy. In another embodiment, the discontinuous grading is that, one or more $Al_xGa_{1-x}N$ layers different from the original Al contents showing continuous and regular changes are inserted into the second layers 106 of continuous grading, and $0 \le X \le 1$. For instance, taking the step grading for example, grading is continuously performed after one or more AlGaN layers are inserted between the $Al_{0.9}Ga_{0.1}N$ layers and the $Al_{0.8}Ga_{0.2}N$ layers. In an alternative embodiment, the aluminum (Al) contents (i.e., the X values) of the second layers 106 may also gradually increase in the direction from the substrate 100 toward the semiconductor layer 108.

In an embodiment, a thickness of each of the first layers 104 may be, for example, greater than 3 nm. Nevertheless, the invention should not be construed as limited thereto. The thickness of each of the first layers 104 provided by the embodiments of the invention may be adjusted according to device design. In other embodiments, the thickness of each of the first layers 104 may be, for example but not limited to, 3 nm to 150 nm. In an alternative embodiment, the thickness of each of the first layers 104 may be, for example but not limited to 4 run to 6 nm.

Note that stress accumulation led by a lattice constant between the substrate 100 and the semiconductor layer 108 may be mitigated by the buffer structure 102. As such, stress generated by different thermal expansion coefficients between the semiconductor layer 108 and the substrate 100 may be decreased by the buffer structure 102 of this embodiment, and cracking or fragmentation problem is thus prevented. In addition, the Al content of the second layer 106a at a lowest region is greater than the Al content of the second layer 106d at a top region, epitaxial quality can thus be increased and following device development can also be facilitated.

In an embodiment, a method of forming the buffer structure 102 may include metal organic chemical vapor deposition (MOCVD) or molecular beam epitaxy (MBE).

Taking the MOCVD for example, when forming the buffer structure 102, trimethyl aluminum (TMA) may be used as reaction gas of Al source; trimethyl gallium (TMG) may be used as the reaction gas of Ga source; $NH_3$ may be used as the reaction gas of N source. The reaction gases of TMA and $NH_3$ are provided into a chamber of MOCVD, so as to epitaxially grow the first layers 100 (i.e., the AlN layers) on the substrate 100. Next, TMA, TMG, and $NH_3$ are further provided, so as to epitaxially grow the second layer 106a (i.e., the $Al_xGa_{1-x}N$ layer, $0 \leq X \leq 1$) on the first layers 104. The Al content of each of the second layers 106 may be adjusted through controlling a mixing ratio of TMA to TMG. Afterwards, the foregoing steps are repeated, so as to form the buffer structure 102 having the first layers 104 and the second layers 106 alternately stacked. Besides, the lowest first layer 104 is in direct contact with the substrate 100 in FIG. 1. Nevertheless, the invention should not be construed as limited thereto. In other embodiments, it can be the lowest second layer 106a is in direct contact with the substrate 100.

Note that in the present embodiment, a sum of thicknesses of the first layers 104 account for 17% to 21% of a total thickness of the buffer structure 102. In this case, a number of the first layers 104 ranges between 2 and 112, and a bow of the semiconductor device 10 formed may be controlled to be less than 10 m. Cracks on the subsequently formed semiconductor layer 108 may also be less than 3 mm. Generally, when the bow increases, manufacturing of the semiconductor device or a light-emitting device becomes more difficult, the bow is thus controlled to be less than 10 μm in this embodiment, so as to facilitate following semiconductor processing. In addition, in other embodiments, the number of the first layers 104 may range between 42 and 112. In an alternative embodiment, the number of the first layers 104 may range between 56 and 70. By following such limit of the number, the semiconductor layer 108 with thick thickness and high quality can thus be formed through the embodiments of the invention. That is, a thickness of the semiconductor layer 108 may account for as high as approximately 60% of a total thickness of the semiconductor device 10, and the bow and the cracks of the semiconductor device 10 may still be controlled to be within the foregoing standard.

The semiconductor layer 108 is located on the buffer structure 102, and the buffer structure 102 is thereby located between the substrate 100 and the semiconductor layer 108. In an embodiment, the semiconductor layer 108 may be a nitride semiconductor layer, for example, a doped gallium nitride (GaN) layer, an intrinsic GaN layer, or a combination thereof. A method of forming the semiconductor layer 108 may include, for example, MOCVD or MBE.

As described above, dislocation led by lattice mismatch and deformation led by different thermal expansion coefficients between the substrate 100 and the subsequently-formed semiconductor layer 108 can thus be reduced through the buffer structure 102 of this embodiment, and moreover, cracks that may be generated may also be suppressed. In addition, an epitaxial stress of the semiconductor layer 108 may also be decreased and an epitaxial thickness of the semiconductor layer 108 may also be increased through the buffer structure 102 of this embodiment, and thereby a breakdown voltage of the semiconductor device 10 is further increased.

Figure 3:
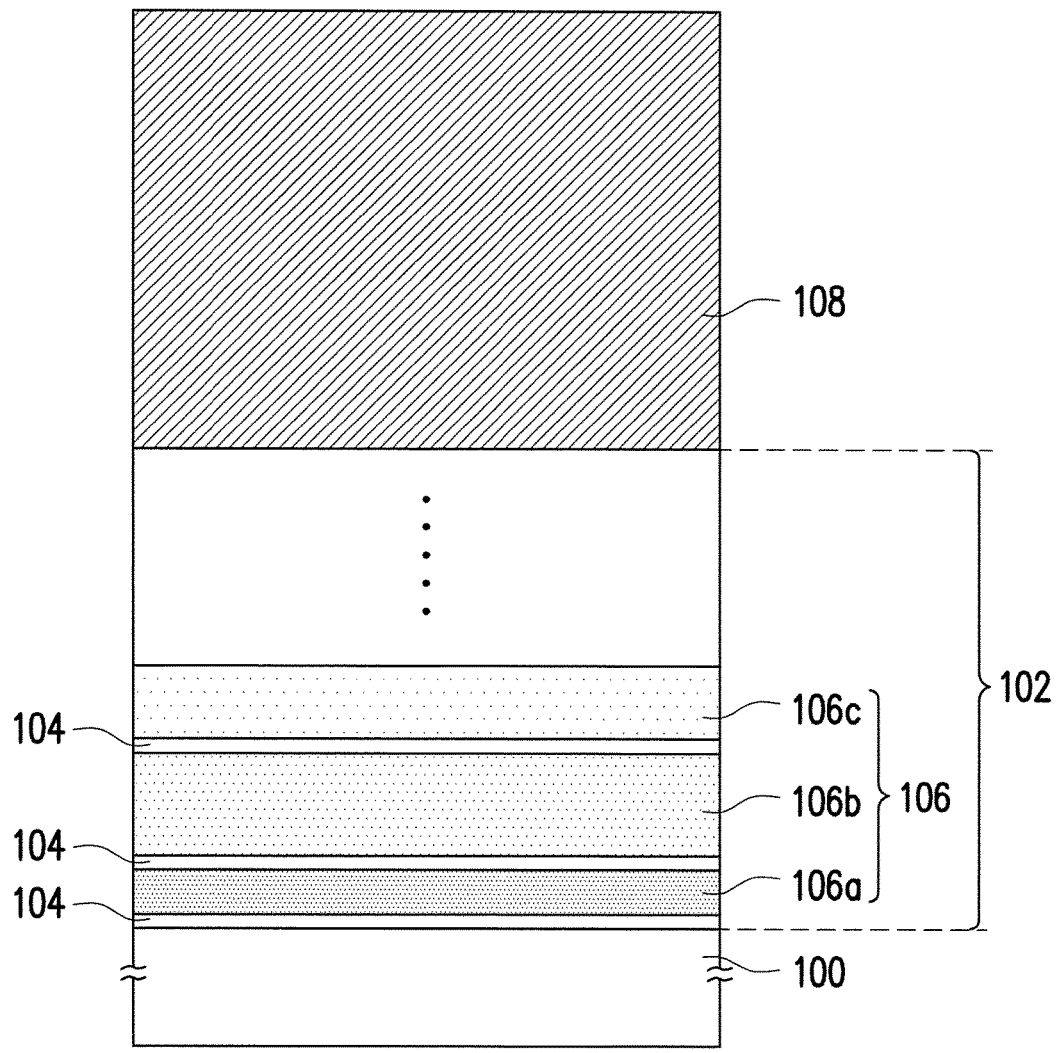
FIG. 3 is a schematic cross-sectional diagram of a semiconductor device according to a third embodiment of the invention.

Besides, in the buffer structure 102 of the foregoing embodiment, the first layers 104 and the second layers 106 may be viewed to be alternately stacked with the same pitch, but the invention is not limited to the above. In other embodiments, in the buffer structure, the first layers and the second layers may also be alternately stacked with different pitches (such as a semiconductor device 30 of FIG. 3). To be specific, the buffer structure has a bottom region, a middle region, and a top region. The bottom region of the buffer structure is close to the substrate; the top region of the buffer structure is close to the semiconductor layer; the middle region is located between the bottom region and the top region. When the first layers and the second layers are alternately stacked with different pitches, the sum of thicknesses of the first layers accounts for less than 20% of the total thickness of the buffer structure. In an embodiment, the number of the first layers at the bottom region is equal to the number of the first layers at the top region, and the number of the first layers at the bottom region is greater than the number of the first layers at the middle region. Nevertheless, the invention should not be construed as limited thereto. In other embodiments, the number of the first layers at the top region may also be greater than the number of the first layers at the bottom region, and the number of the first layers at the bottom region is equal to the number of the first layers at the middle region.

Figure 2:
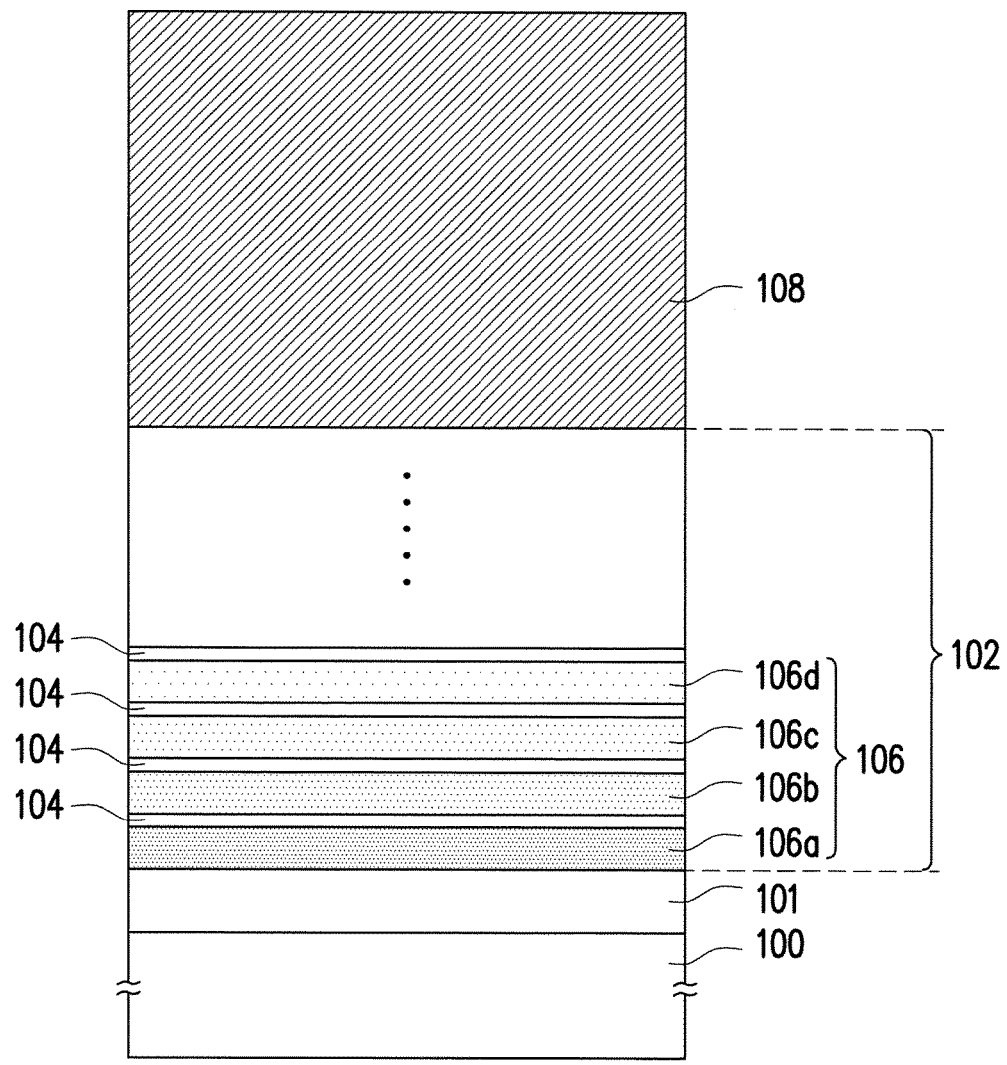
FIG. 2 is a schematic cross-sectional diagram of a semiconductor device according to a second embodiment of the invention.

FIG. 2 is a schematic cross-sectional diagram of a semiconductor device according to a second embodiment of the invention.

With reference to FIG. 2, basically, a semiconductor device 20 of the second embodiment is similar to the semiconductor device 10 of the first embodiment, but a difference therebetween includes that the semiconductor device 20 of the second embodiment further includes a nucleation layer 101 located between the substrate 100 and the buffer structure 102.

Figure 4:
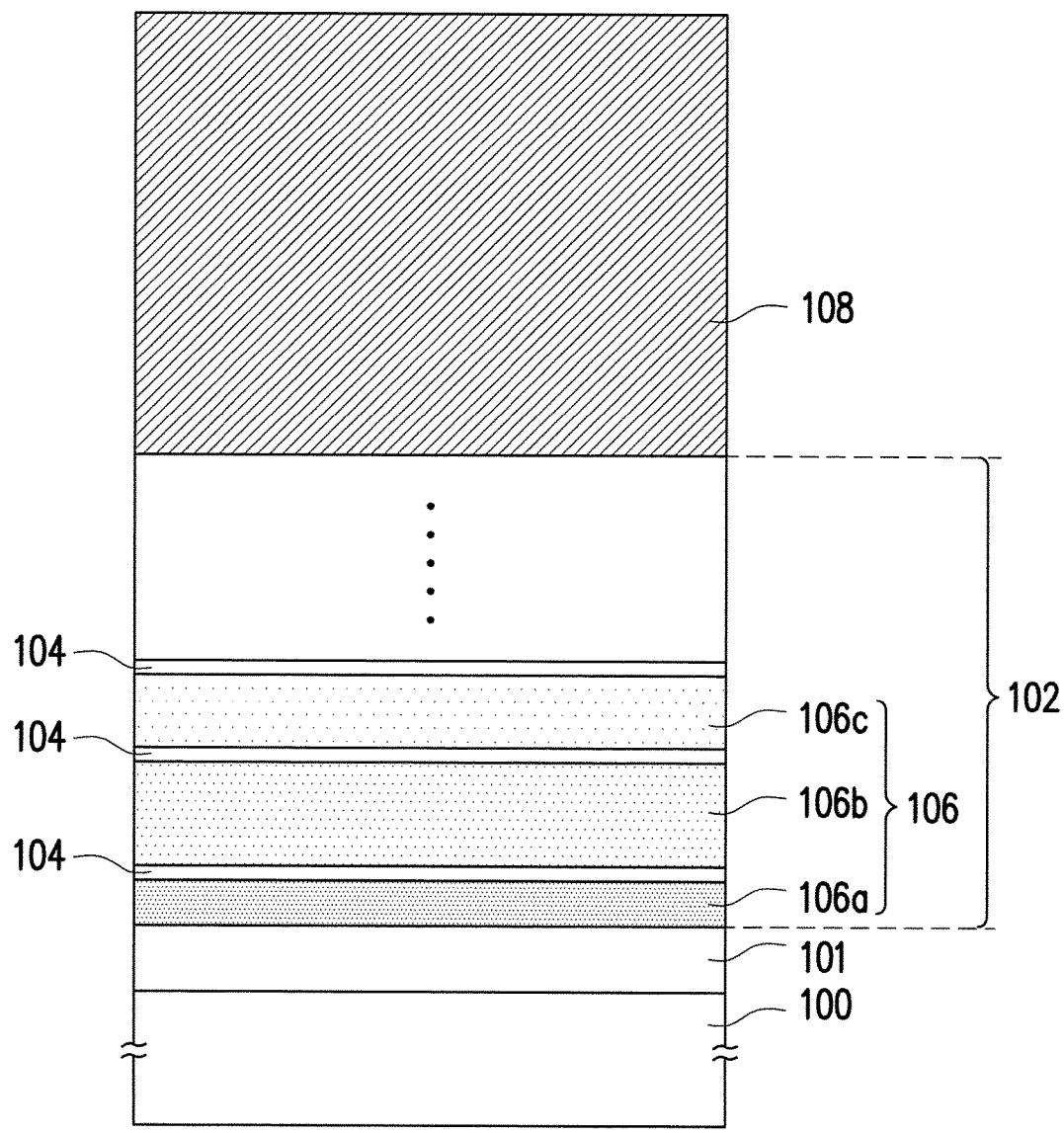
FIG. 4 is a schematic cross-sectional diagram of a semiconductor device according to a fourth embodiment of the invention.

In an embodiment, the nucleation layer 101 may include AlN layers, Al layers, or a combination thereof. A method of forming the nucleation layer 101 may be, for example, MOCVD or MBE, and a thickness of the nucleation layer 101 may range between 20 n to 200 nm. Note that the nucleation layer 101 may prevent Si of the substrate 100 to react with Ga of the buffer structure 102 or the semiconductor layer 108 which may lead to a melt-back phenomenon generated by eutectic metal. In addition, the nucleation layer 101 is able to increase the epitaxial quality of the semiconductor layer 108 formed thereon. That is, the semiconductor device 20 having the nucleation layer 101 has less defects. Besides, in the buffer structure 102 of the foregoing embodiment, the first layers 104 and the second layers 106 may be viewed to be alternately stacked with the same pitch, but the invention is not limited to the above. In other embodiments, in the buffer structure, the first layers and the second layers may also be alternately stacked with different pitches (such as a semiconductor device 40 of FIG. 4).

Besides, the lowest second layer 106a is in direct contact with the nucleation layer 101 in FIG. 2. Nevertheless, the invention should not be construed as limited thereto. In other embodiments, it can be the lowest first layers 104 located is in direct contact with the substrate 100.

A plurality of examples are provided as follows to further describe the semiconductor device provided by the embodiments of the invention in order to verify realizability of the invention. Although the following experiment is described, the materials used and the amount and ratio thereof, as well as handling details and handling process, etc., can be suitably modified without exceeding the scope of the disclosure. Accordingly, restrictive interpretation should not be made to the invention based on the experiment described below.

TABLE 1

| Sample | Number of AlN Layers | Number/Thickness (nm) of AlN Layers | | | Crystal Quality | |
|---|---|---|---|---|---|---|
| | | Bottom Region | Middle Region | Top Region | 002/102 (arcsec) | Bow (μm) |
| Comparative Example 1 | 56 | 14/5.40 | 14/5.40 | 28/5.40 | 559/700 | −5 |
| Comparative Example 2 | 56 | 14/4.77 | 14/4.77 | 28/4.77 | 510/662 | −20 |
| Comparative Example 3 | 92 | 23/4.77 | 23/4.77 | 46/4.77 | 497/611 | 14 |
| Comparative Example 4 | 42 | 14/5.40 | 14/5.40 | 14/5.40 | 561/740 | −8 |
| Experimental Example 1 | 112 | 28/2.70 | 28/2.70 | 56/2.70 | 546/652 | 14 |
| Experimental Example 2 | 70 | 28/4.77 | 14/4.77 | 28/4.77 | 491/608 | 2 |
| Experimental Example 3 | 112 | 23/4.77 | 23/4.77 | 66/4.77 | 490/592 | 11 |
| Experimental Example 4 | 56 | 14/5.40 | 14/5.40 | 28/2.70 | 556/712 | 6 |

In can be seen in Table 1, when the number of the AlN layers increases, defects of the GaN layer formed decrease (referring to Comparative Example 1 and Experimental Example 1). In other words, the GaN layer having more layers of the AlN layers has better epitaxial quality. In addition, when the number of the AlN layers at the bottom region increases, the defects of the GaN layer formed decrease (referring to Comparative Example 2 and Experimental Example 2). When the number of the AlN layers at the top region increases, the defects of the GaN layer formed also decrease (referring to Comparative Example 3 to Comparative Example 4 and Experimental Example 3 to Experimental Example 4).

Experimental Example 1

A single-crystal silicon substrate having a (111) crystal plane is provided. Next, MOCVD is applied to form a buffer structure with a thickness of less than 3 μm and an intrinsic GaN layer with a thickness of greater than or equal to 2 m in sequence on the (111) crystal plane of the silicon substrate. Specifically, the buffer structure includes 112 AlN layers and 112 $Al_xGa_{1-x}N$ layers ($0 \leq x \leq 1$) alternately stacked. The buffer structure has a bottom region, a middle region, and a top region. The numbers of layer and thicknesses of the AlN layers are distributed as shown in Table 1. Afterwards, a test is performed on the GaN layer of Experimental Example 1, and test results are shown in Table 1 above.

Experimental Example 2 to Experimental Example 4, Comparative Example 1 to Comparative Example 4

A method of forming a semiconductor device of Experimental Example 2 to Experimental Example 4 and Comparative Example 1 to Comparative Example 4 is similar to the method of forming the semiconductor device of Experimental Example 1. A difference between Experimental Example 2 to Experimental Example 4 and Comparative Example 1 to Comparative Example 4 and Experimental Example 1 involves the numbers of layer, thicknesses, and distributions of the AlN layers in the buffer structure. A test is then performed on the GaN layer of Experimental Example 2 to Experimental Example 4 and Comparative Example 1 to Comparative Example 4, and test results are shown in Table 1 above.

Experimental Example 5

A single-crystal silicon substrate having a (111) crystal plane is provided. Next, MOCVD is applied to a form nucleation layer (i.e., the AlN layer) with a thickness of 100 nm, a buffer structure with a thickness of less than 3 μm, and an intrinsic GaN layer with a thickness of greater than or equal to 2 μm in sequence on the (111) crystal plane of the silicon substrate. Specifically, the buffer structure includes an entire piece of $Al_xGa_{1-x}N$ layer ($0 \leq x \leq 1$). A test is then performed on the GaN layer of Experimental Example 5, and test results are shown in Table 2 below.

Experimental Example 6

A single-crystal silicon substrate having a (111) crystal plane is provided. Next, MOCVD is applied to form a nucleation layer (i.e., the AlN layer) with a thickness of 100 nm, a buffer structure with a thickness of less than 3 μm, and an intrinsic GaN layer with a thickness of greater than or equal to 2 μm in sequence on the (111) crystal plane of the silicon substrate. Specifically, the buffer structure includes 2 AlN layers and 2 $Al_xGa_{1-x}N$ layers ($0 \leq x \leq 1$) alternately stacked. A structure of a semiconductor device of Experimental Example 6 is shown in FIG. 2. Note that the number of the AlN layers in Table 2 refers to the number of the AlN layers in the buffer structure; a sum of thicknesses of the AlN layers refers to thicknesses of the AlN layers in the buffer structure plus a thickness of the nucleation layer. A test is then performed on the GaN layer of Experimental Example 6, and test results are shown in Table 2 below.

Experimental Example 7 to Experimental Example 11

A method of forming a semiconductor device of Experimental Example 7 to Experimental Example 11 is similar to the method of forming the semiconductor device of Experimental Example 6. A difference between Experimental Example 7 to Experimental Example 11 and Experimental Example 6 involves the number of the AlN layers in the buffer structure. Note that the thicknesses of the AlN layers in the buffer structure of Experimental Example 6 to Experimental Example 11 are different. A test is then performed on the GaN layer of Experimental Example 7 to Experimental Example 11, and test results are shown in Table 2 below.

TABLE 2

| Sample | Number of AlN Layers | Sum of Thicknesses of AlN Layers | Thickness of Buffer Structure | Thickness of GaN Layer | Bow (μm) | Cracks (mm) |
|---|---|---|---|---|---|---|
| Experimental Example 5 | 0 | 19% | 28% | 72% | 10 | 8.0 |
| Experimental Example 6 | 2 | 18% | 25% | 75% | 10 | 4.7 |

TABLE 2-continued

| Sample | Number of AlN Layers | Sum of Thicknesses of AlN Layers | Thickness of Buffer Structure | Thickness of GaN Layer | Bow (µm) | Cracks (mm) |
|---|---|---|---|---|---|---|
| Experimental Example 7 | 3 | 17% | 23% | 77% | 10 | 4.1 |
| Experimental Example 8 | 56 | 21% | 31% | 69% | 9 | 1.7 |
| Experimental Example 9 | 70 | 21% | 31% | 69% | 5 | 0.8 |
| Experimental Example 10 | 92 | 19% | 39% | 61% | 10 | 1.5 |
| Experimental Example 11 | 112 | 20% | 46% | 54% | 7 | 0.6 |

As shown in Table 2, sums of thicknesses of the AlN layers (i.e., the first layers plus the nucleation layer) of Experimental Example 7 to Experimental Example 11 all account for less than 21% of the total thickness of the buffer structure. That is, when the sums of thicknesses of the AlN layers are identical, relationships between the number of the AlN layers and the thickness of the GaN layer as well as the number of the AlN layers and the cracks can be observed.

To be specific, as shown in Experimental Example 5 to Experimental Example 11, although the semiconductor device of Experimental Examples 5 to Experimental Example 7 has the thicker GaN layer, cracks generated on the GaN layer of Experimental Examples 5 to Experimental Example 7 are greater than 3 mm. In contrast, the thickness of the GaN layer of Experimental Example 8 to Experimental Example 9 accounts for as high as approximately 70%; moreover, cracks generated on the GaN layer of Experimental Example 8 to Experimental Example 9 are less than 3 mm. In other words, when the number of the AlN layers (i.e., the first layers) ranges between 56 and 112, the silicon substrate is prevented from deformation and less cracks are formed, and thereby, the epitaxial thickness and quality of the semiconductor layer are increased.

Experimental Example 12

A single-crystal silicon substrate having a (111) crystal plane is provided. Next, MOCVD is applied to form an AlN layer with a thickness of 100 nm, a buffer structure with a thickness of less than 3 µm, and an intrinsic GaN layer with a thickness of greater than or equal to 2 µm in sequence on the (111) crystal plane of the silicon substrate. Specifically, the buffer structure sequentially includes a first group constituted by 17 AlN layers (with a thickness of 5 nm) and 17 $Al_xGa_{1-x}N$ layers (with a thickness of 17 nm and $0 \leq x \leq 1$) alternately stacked; a second group constituted by 17 AlN layers (with a thickness of 5 nm) and 17 $Al_xGa_{1-x}N$ layers (with a thickness of 21 nm and $\leq x \leq 1$) alternately stacked; a third group constituted by 28 AlN layers (with a thickness of 5 nm) and 28 $Al_xGa_{1-x}N$ layers (with a thickness of 20 nm and $0 \leq x \leq 1$) alternately stacked. A test is then performed on the GaN layer of Experimental Example 12, and test results are shown in Table 3 below.

Comparative Example 5

A method of forming a semiconductor device of Comparative Example 5 is similar to the method of forming a semiconductor device of Experimental Example 12. A difference between Comparative Example 5 and Experimental Example 12 includes that the Comparative Example 5 does not have the AlN layer acts as the nucleation layer. That is, a thinner AlN layer (with a thickness of 5 nm) is directly formed on the (111) crystal plane of the single-crystal silicon substrate in Comparative Example 5; a thicker AlN layer (with a thickness of 100 nm) is directly formed on the (111) crystal plane of the single-crystal silicon substrate in Experimental Example 12. Afterwards, a test is performed on the GaN layer of Comparative Example 5, and test results are shown in Table 3.

TABLE 3

| Sample | Crystal Quality 002/102 (arcsec) |
|---|---|
| Experimental Example 12 | 532/614 |
| Comparative Example 5 | 553/680 |

It can be seen in Table 3 that the semiconductor device having the nucleation layer has less defects. In other words, the GaN layer of Experimental Example 12 provides better epitaxial quality.

In addition, the numbers of the AlN layers and the sums of the thicknesses of the AlN layers (accounting for the total thickness of the buffer structure) of Experimental Example 1 to Experimental Example 11 are compared and are shown in Table 4 below. In Table 4, it can be seen that when the AlN layers and the $Al_xGa_{1-x}N$ layers ($0 \leq x \leq 1$) are alternately stacked with different pitches, if the number of the AlN layers is less than 112, the sum of the thicknesses of the AlN layers and the bow value may be effectively reduced. That is, if the buffer structure is constituted through the method of alternative stacking with different pitches rather than the method of alternative stacking with the same pitches, the crystal quality of the semiconductor layer on the buffer structure is enhanced, and the epitaxial thickness of the semiconductor layer is also increased.

TABLE 4

| Sample | Number of AlN Layers | Sum of Thicknesses of AlN Layers | Bow (µm) |
|---|---|---|---|
| Experimental Example 1 | 112 | 20% | 14 |
| Experimental Example 2 | 70 | 14% | 2 |
| Experimental Example 3 | 112 | 17% | 11 |
| Experimental Example 4 | 56 | 16% | 6 |
| Experimental Example 5 | 0 | 19% | 10 |
| Experimental Example 6 | 2 | 18% | 10 |
| Experimental Example 7 | 3 | 17% | 10 |
| Experimental Example 8 | 56 | 21% | 9 |
| Experimental Example 9 | 70 | 21% | 5 |
| Experimental Example 10 | 92 | 19% | 10 |
| Experimental Example 11 | 112 | 20% | 7 |

In view of the foregoing, the buffer structure of the embodiments of the invention is formed between the substrate and the semiconductor layer. The buffer structure includes plural first layers and plural second layers. The first layers and the second layers are alternately stacked with the same pitch or with different pitches. In the buffer structure provided by the embodiments of the invention, lattice mismatch and differences in thermal expansion coefficients between the substrate and the semiconductor layer are reduced, such that the substrate is further prevented from being deformed and cracks generated on the semiconductor layer are reduced. In addition, the epitaxial stress of the semiconductor layer may be decreased and the epitaxial thickness of the semiconductor layer is increased through the buffer structure provided by the embodiments of the invention, and thereby, the breakdown voltage of the semiconductor device is further increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A semiconductor device, comprising:
   a substrate;
   a semiconductor layer, located on the substrate; and
   a buffer structure located between the substrate and the semiconductor layer, the buffer structure comprising a plurality of first layers and a plurality of second layers, the first layers and the second layers being alternately stacked, wherein a number of the first layers is greater than or equal to 56, and a bow of the semiconductor device is less than 10 µm, wherein the first layers comprise AlN, the second layers comprise $Al_xGa_{1-x}N$, and $0 \leq X \leq 1$, and Al contents (X values) of the second layers gradually decrease in a direction from the substrate toward the semiconductor layer.

2. The semiconductor device as claimed in claim 1, wherein a sum of thicknesses of the first layers accounting for 17% to 21% of a total thickness of the buffer structure when the first layers and the second layers are alternately stacked with a same pitch.

3. The semiconductor device as claimed in claim 1, wherein the number of the first layers ranges between 56 and 70.

4. The semiconductor device as claimed in claim 1, wherein the buffer structure has a bottom region, a middle region, and a top region, and the number of the first layers at the bottom region is equal to the number of the first layers at the top region, and the number of the first layers at the bottom region is greater than the number of the first layers at the middle region when the first layers and the second layers are alternately stacked with different pitches,
   wherein a sum of thicknesses of the first layers accounts for less than 20% of a total thickness of the buffer structure.

5. The semiconductor device as claimed in claim 1, wherein the buffer structure has a bottom region, a middle region, and a top region, and the number of the first layers at the top region is greater than the number of the first layers at the bottom region, and the number of the first layers at the bottom region is equal to the number of the first layers at the middle region when the first layers and the second layers are alternately stacked with different pitches,
   wherein a sum of thicknesses of the first layers accounts for less than 20% of a total thickness of the buffer structure.

6. The semiconductor device as claimed in claim 1, further comprising a nucleation layer located between the substrate and the buffer structure.

7. A method of forming a semiconductor device, comprising:
   providing a substrate;
   forming a semiconductor layer on the substrate; and
   forming a buffer structure between the substrate and the semiconductor layer, the buffer structure comprising a plurality of first layers and a plurality of second layers, the first layers and the second layers being alternately stacked, wherein a number of the first layers is greater than or equal to 56, and a bow of the semiconductor device is less than 10 µm, wherein the first layers comprise AlN, the second layers comprise $Al_xGa_{1-x}N$, and $0 \leq X \leq 1$, and Al contents (X values) of the second layers gradually decrease in a direction from the substrate toward the semiconductor layer.

8. The method of forming the semiconductor device as claimed in claim 7, a sum of thicknesses of the first layers accounting for 17% to 21% of a total thickness of the buffer structure when the first layers and the second layers are alternately stacked with a same pitch.

9. The method of forming the semiconductor device as claimed in claim 7, wherein the number of the first layers ranges between 56 and 70.

10. The method of forming the semiconductor device as claimed in claim 7, wherein the buffer structure has a bottom region, a middle region, and a top region, and the number of the first layers at the bottom region is equal to the number of the first layers at the top region, and the number of the first layers at the bottom region is greater than the number of the first layers at the middle region when the first layers and the second layers are alternately stacked with different pitches,
    wherein a sum of thicknesses of the first layers accounts for less than 20% of a total thickness of the buffer structure.

11. The method of forming the semiconductor device as claimed in claim 7, wherein the buffer structure has a bottom region, a middle region, and a top region, and the number of the first layers at the top region is greater than the number of the first layers at the bottom region, and the number of the first layers at the bottom region is equal to the number of the first layers at the middle region when the first layers and the second layers are alternately stacked with different pitches,
    wherein a sum of thicknesses of the first layers accounts for less than 20% of a total thickness of the buffer structure.

* * * * *